United States Patent [19]

Chin et al.

[11] Patent Number: 4,908,183

[45] Date of Patent: Mar. 13, 1990

[54] HIGH STRENGTH SINGLE CRYSTAL SUPERALLOYS

[75] Inventors: Stephen Chin, Wallingford; David N. Duhl, Newington, both of Conn.

[73] Assignee: United Technologies Corporation, Hartford, Conn.

[21] Appl. No.: 169,165

[22] Filed: Mar. 9, 1988

Related U.S. Application Data

[63] Continuation of Ser. No. 794,025, Nov. 1, 1985, abandoned.

[51] Int. Cl.⁴ .............................................. C22C 19/05
[52] U.S. Cl. .................................... 420/448; 148/404; 148/410; 148/428
[58] Field of Search .................... 148/404, 410, 428; 420/448

[56] References Cited

U.S. PATENT DOCUMENTS 4,222,794 9/1980 Schweizer et al. ................ 148/428
4,765,850 8/1988 Schweizer ........................... 148/404

FOREIGN PATENT DOCUMENTS 0150917 8/1985 European Pat. Off. .
2374427 9/1977 France .

Primary Examiner—R. Dean
Attorney, Agent, or Firm—James M. Rashid

[57] ABSTRACT

Nickel base superalloys having properties equal to or better than alloys currently used in gas turbine engines are described. Preferably, the alloys of the present invention are cast into single crystals.

4 Claims, 1 Drawing Sheet

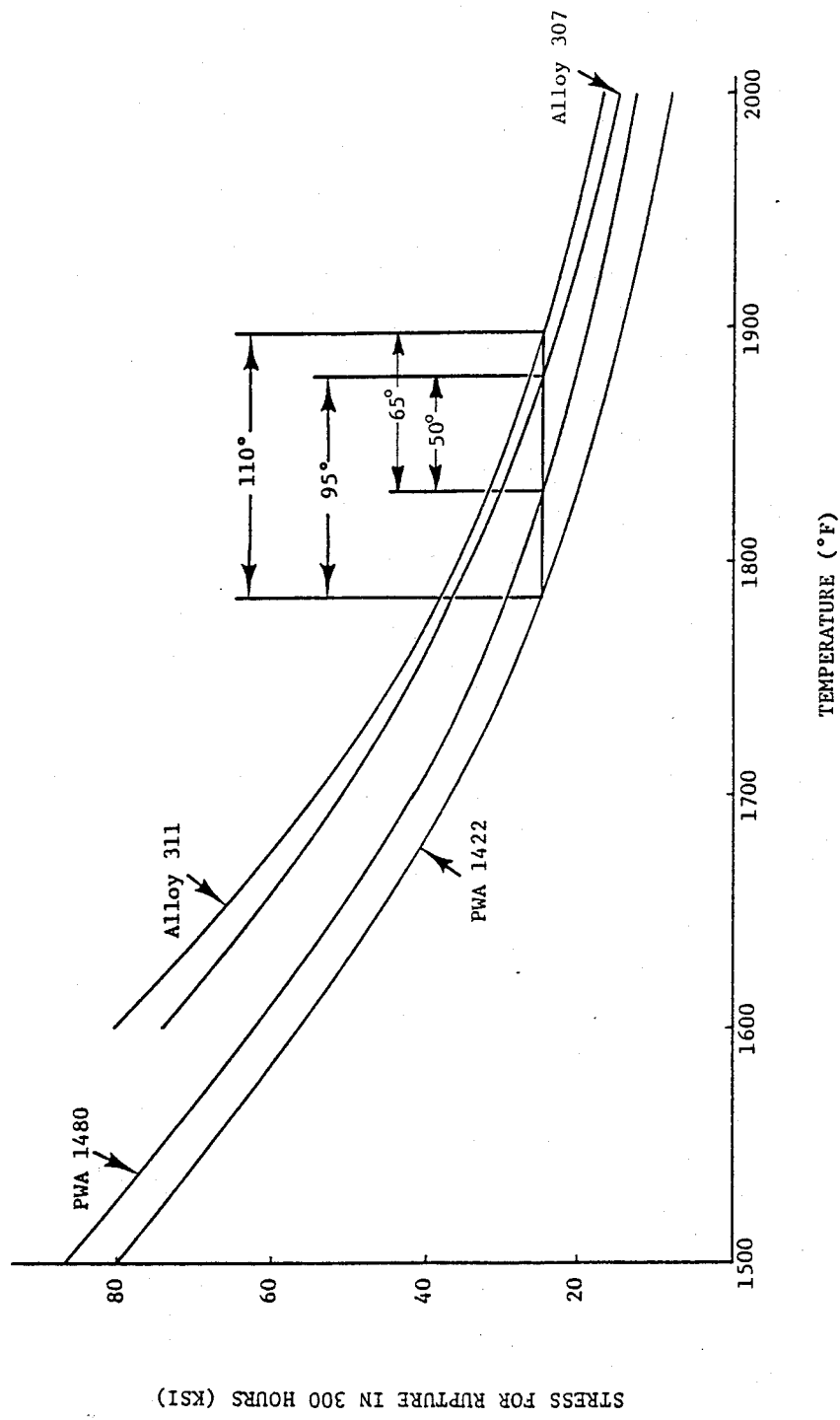

HIGH STRENGTH SINGLE CRYSTAL SUPERALLOYS

This application is a continuation of application Ser. No. 794,025, filed Nov. 1, 1985, abandoned.

TECHNICAL FIELD

This invention relates to nickel base superalloys, and in particular, to single crystal nickel base superalloys for use in gas turbine engines.

BACKGROUND ART

Nickel base superalloys have been extensively studied for many years. As a result, numerous alloys have been developed which display desireable properties under adverse operating conditions. Because of their properties, nickel base superalloys have found wide application in gas turbine engines. The following United States patents disclose some nickel base alloy compositions which have been developed for use in the gas turbine engine industry. All compositions are on a weight percent basis.

U.S. Pat. No. 4,222,794 describes a single crystal nickel base superalloy having desireable high temperature mechanical properties and resistance to oxidation and hot corrosion. The composition of this alloy is 4.5–6.0 Cr, 0.0–7.0 Co, 1.7–2.3 Mo, 4.0–6.0 W, 1.0–5.0 Re, 5.0–5.8 Al, 0.8–1.5 Ti, 5.5–5.8 Ta, 0.2–0.6 V, with the balance nickel.

U.S. Pat. No. 4,371,404 describes a single crystal nickel base superalloy whose composition is 6.5–8.2 Cr, 3.0–8.0 Co, 1.7–2.3 Mo, 3.0–5.0 W, up to 3.0 Re, 4.5–5.5 Al, 0.7–1.5 Ti, 10.0–13.5 Ta, with the balance nickel.

Other U.S. Patents which are indicative of the general state of the art relative to single crystal nickel base superalloys are U.S. Pat. Nos. 4,116,723 and 4,402,772.

U.S. Patents which describe columnar grained nickel base superalloys are e.g., 3,526,499, 3,887,363, 3,904,402, 3,944,416, 4,169,742, 4,284,430, 4,292,076, 4,388,124, 4,522,664, and Re. 29,920. These superalloy compositions include grain boundary strengthening agents such as C, B, and Zr. Single crystal nickel base superalloys such as those of the present invention achieve their desireable mechanical properties in the absence of such grain boundary strengthening elements.

DISCLOSURE OF THE INVENTION

This invention relates to superalloys suited for use at elevated temperatures, and in particular, to single crystal nickel base superalloys for gas turbine engines. The alloys of the present invention exhibit good creap strength, stable microstructures, and good oxidation and hot corrosion resistance. The composition of the alloys of the present invention is, on a weight percent basis, 4.0–5.5 Cr, 7.5–12.0 Co, 1.5–2.5 Mo, 1.0–6.0 W, 2.0–4.0 Re, 4.5–5.5 Al, 0.5–1.5 Ti, 8.0–12.0 Ta, with the balance nickel. The alloys may also include minor additions of V and Hf. The alloys contain no intentional additions of the elements B, Cb, C, or Zr, although these elements may be present as impurities.

The alloys are fabricated in single crystal form by known casting techniques; the cast component is then homogenized, or solutionized, by heating at an elevated temperature, and the gamma prime strengthening phase $Ni_3(Al,Ti)$ precipitates on cooling from the solutionizing temperature.

When processed as described hereinbelow, the alloys of the present invention have an exceptional combination of properties. The combination of these properties, including mechanical strength at elevated temperatures and resistance to oxidation and hot corrosion makes the alloys suitable for use in high temperature sections of gas turbine engines.

The foregoing, and other objects, features and advantages of the present invention will become more apparent in the light of the following detailed description of the preferred embodiment thereof.

BRIEF DESCRIPTION OF THE DRAWING

The FIGURE shows normalized stress rupture data plotted as a function of test temperature, comparing alloys of the present invention with two currently used nickel base superalloys.

BEST MODE FOR CARRYING OUT THE INVENTION

The present invention relates to nickel base superalloys which have an exceptional combination of properties. The alloys have practical utility in single crystal form. Formation of the alloys into a single crystal is an important aspect of the invention, but the exact method and details of the single crystal formation are not critical. Solidification techniques which may be used are described in U.S. Pat. No. 3,494,709, which is incorporated by reference.

The broad composition range for the alloys of the present invention is shown in Table I. Also shown in Table I are two preferred compositions which are within the broad range. These preferred compositions are hereinafter referred to as Alloy 307 and Alloy 311. While the alloys contain no intentional additions of B, Cb, C, or Zr, these elements may be present as impurities, in the levels indicated in the Table. Table I also presents the compositions of two nickel base superalloys which are currently used in gas turbine engines, and which were compared in laboratory tests with the alloys of the present invention. The alloy designated PWA 1422 in Table I has a columnar grain microstructure, while the alloy designated PWA 1480 has a single crystal microstructure. PWA 1480 is one of the strongest alloys known to Applicants from which airfoils currently used in gas turbine engines are fabricated.

TABLE I

| | Alloy Composition (Weight Percent) | | | | |
| | Invention | | | Prior Art | |
| Element | Broad | Alloy 307 | Alloy 311 | PWA 1422 | PWA 1480 |
| --- | --- | --- | --- | --- | --- |
| Cr | 4.0–5.5 | 4.6 | 5.1 | 9.0 | 10.0 |
| Co | 7.5–12.0 | 9.8 | 10.2 | 10.0 | 5.0 |
| Mo | 1.5–2.5 | 1.8 | 2.0 | 0.0 | 0.0 |
| W | 1.0–6.0 | 2.0 | 5.0 | 12.0 | 4.0 |
| Re | 2.0–4.0 | 3.0 | 3.0 | 0.0 | 0.0 |
| Al | 4.5–5.5 | 4.9 | 5.1 | 5.0 | 5.0 |
| Ti | 0.5–1.5 | 1.0 | 0.92 | 2.0 | 1.5 |
| Ta | 8.0–12.0 | 11.9 | 9.1 | 0.0 | 12.0 |
| V | 0.0–1.0 | 0.0 | 0.5 | 0.0 | 0.0 |
| Hf | 0.0–0.5 | 0.0 | 0.1 | 2.0 | 0.0 |
| B | 0.0–0.01 | 0.0 | 0.0 | 0.015 | 0.0 |
| Cb | 0.0–0.2 | 0.0 | 0.0 | 1.0 | 0.0 |
| C | 0.0–0.05 | 0.0 | 0.0 | 0.1 | 0.0 |
| Zr | 0.0–0.01 | 0.0 | 0.0 | 0.0 | 0.0 |
| Ni | Balance | Balance | Balance | Balance | Balance |

Creep rupture tests were performed, at various test conditions, on Alloy 307 and Alloy 311 specimens, as well as on test specimens of the aforementioned, currently used alloys PWA 1422 and PWA 1480. Results of these tests are presented in Table II. As is seen in the Table, in terms of rupture life, Alloy 307 has about seven times the life of PWA 1422 at all test conditions, and about 2.5 times the life of PWA 1480 at all test conditions. Table II also shows that Alloy 311 has about nine times the life of PWA 1422 and more than three times the life of PWA 1480. On the basis of the time to one percent creep, the alloys of the present invention exhibited strength advantages over the alloys PWA 1422 and PWA 1480 which were similar to their respective rupture life advantages.

TABLE II

Creep-Rupture Properties

| Alloy | Test Conditions | 1% Creep Life (Hours) | Rupture Life (Hours) |
|---|---|---|---|
| 307 | 1600° F., 75 ksi | 37 | 259 |
| 311 | 1600° F., 75 ksi | — | 440 |
| 1480 | 1600° F., 75 ksi | 24 | 105 |
| 1422 | 1600° F., 75 ksi | 8 | 40 |
| 307 | 1800° F., 36 ksi | 95 | 242 |
| 311 | 1800° F., 36 ksi | 122 | 283 |
| 1480 | 1800° F., 36 ksi | 38 | 91 |
| 1422 | 1800° F., 36 ksi | 10 | 33 |
| 307 | 2000° F., 20 ksi | — | — |
| 311 | 2000° F., 20 ksi | — | 112 |
| 1480 | 2000° F., 20 ksi | 14 | 30 |
| 1422 | 2000° F., 20 ksi | 4 | 9 |
| 307 | 2000° F., 18 ksi | 31 | 120 |
| 311 | 2000° F., 18 ksi | — | — |
| 1480 | 2000° F., 18 ksi | 32 | 52 |
| 1422 | 2000° F., 18 ksi | 6 | 14 |

The Figure is a graphical representation of the data in Table II, after it has been normalized to a 300 hour rupture life. In the Figure, the stress to fracture a specimen in 300 hours is plotted as a function of test temperature. It is seen that Alloy 307 has about a 95° F. advantage over PWA 1422 at 25 ksi and a 50° F. advantage over PWA 1480 at 25 ksi; similarly, Alloy 311 has about a 110° F. advantage over PWA 1422 at 25 ksi and a 65° F. advantage over PWA 1480 at 25 ksi. The level of 25 ksi can be used to approximate the steady state stress which a turbine airfoil might be expected to experience in the hot section of a gas turbine engine. Thus, the Figure indicates that the alloys of the present invention have better creep strength than two currently used, state of the art nickel base superalloys.

A limiting factor in the use of superalloys in gas turbine engines is oxidation and hot corrosion degradation. Such attack is caused by the extremely harsh environment of the engine. While most superalloys have coatings applied to their surfaces to limit oxidation and hot corrosion, engine designers have long realized that a substrate material having no inherent resistance to environmental attack will not be useful. Thus, superalloy compositions are tailored to provide a desireable combination of mechanical properties and resistance to environmental attack.

To determine the oxidation resistance of the alloys of the present invention, uncoated test specimens were cycled between exposure at 2,100° F. for 29 minutes and forced air cool for 1 minute. These tests were performed on Alloy 307, PWA 1422 and PWA 1480, and they indicated that, in terms of the number of hours to produce 0.001 inch (1 mil) of oxidation degradation in the substrate, Alloy 307 had about 2.6 times the oxidation resistance of PWA 1422, and about 60% of the oxidation resistance of PWA 1480. While no oxidation tests were conducted on Alloy 311, the high aluminum content in the alloy (5.1%) and hafnium content (0.1%) should result in the alloy having excellent oxidation resistance, perhaps even better oxidation resistance than Alloy 307.

To determine the uncoated hot corrosion resistance of the alloys of the present invention, isothermal tests at 1,650° F. were performed. To accelerate the hot corrosion mechanism, the specimens were coated with about 1 milligram per square centimeter of $Na_2SO_4$. These tests indicated that, on the basis of the number of hours to cause 1 mil of corrosion degradation, Alloy 307 had about 60% of the uncoated corrosion resistance of PWA 1422, and Alloy 311 had about 45% of the uncoated corrosion resistance of PWA 1422.

While these tests indicated that the uncoated environmental resistance of the alloys of the present invention is not as good as the resistance of two commercially used alloys, it should be reiterated that the alloys would, if used in a gas turbine engine, be protected by a coating for optimum oxidation and corrosion protection. One of the most useful of these protective coatings is the NiCoCrAlY overlay described in U.S. Pat. No. 3,928,026, which may be applied by a vapor deposition process.

Turbine airfoils are commonly exposed to temperatures of about 2,000° F.; in some applications, exposure to even higher temperatures occurs. To examine the microstructural stability of the alloys of the present invention, tests were conducted to evaluate their behavior when exposed to 1,600°, 1,800° and 2,000° F. for periods up to 1,000 hours. Metallographic examination of Alloy 307 specimens indicated that after these thermal exposures, there was no precipitation of undesireable phases such as sigma, mu, or Laves, which could degrade physical properties. Examination of Alloy 311 specimens after thermal exposure indicated only slight precipitation of such phases after 1,000 hours at 1,800° and 2,000° F. These tests indicate that the alloys of the present invention may have sufficient microstructural stability to withstand the high temperatures which would be experienced by an airfoil in the turbine section of a gas turbine engine.

The alloys of the present invention, being single crystal in structure, derive their strength primarily due to the distribution of the intermetallic gamma prime phase $Ni_3(Al,Ti)$ within the solid solution gamma phase matrix. For a constant volume fraction of gamma prime, considerable variations in strength may be achieved by varying the size and morphology of the gamma prime precipitate within the gamma matrix. These variations are achieved by heat treating the alloys to dissolve into solution with the matrix all or part of the gamma prime, and then reprecipitating the gamma prime as the alloys cool from the solutioning temperature. The ability to optimally heat treat single crystal alloys is a function of the difference between the alloy incipient melting temperature and the gamma prime solvus temperature. Solutioning of all of the as-cast gamma prime phase is commercially practicable if the difference between the incipient melting temperature and the gamma prime solvus temperature is positive. Preferably the difference should be at least about 15° F. Laboratory tests indicated that Alloy 307 had an incipient melting temperature of 2415° F., and a gamma prime solvus temperature of 2395° F.; thus, Alloy 307 has a 20° F. solution heat treatment range. These tests also indicated that Alloy 311 had an incipient melting temperature of 2400° F. and a gamma prime solvus temperature of 2365° F.;

thus, Alloy 311 has a 35° F. solution heat treatment range.

In the alloys of the present invention, the gamma prime phase typically has a cuboidal shape; these alloys will have optimum mechanical properties if, in the heat treated condition, the average gamma prime size (cube edge dimension) is less than about 0.5 microns. Such a microstructure can be achieved by solutioning above the gamma prime solvus temperature but below the incipient melting temperature for about 4 hours, and then cooling at a rate of about 115° F. per minute until about 2000° F. The single crystal articles may then be cooled to room temperature at a rate equal to, or greater than, air cool. Finally, the articles are given an aging treatment at about 1,600° F. for 32 hours. For Alloy 307, an appropriate solutioning temperature would be about 2410° F., while an appropriate solutioning temperature for Alloy 311 would be about 2370° F.

Although the invention has been shown and described with respect to a preferred embodiment thereof, it should be understood by those skilled in the art that other various changes and omissions in the form and detail thereof may be made therein without departing from the spirit and scope of the invention.

We claim:

1. An alloy composition suitable for casting into a single crystal nickel base superalloy article, the alloy composition consisting essentially of, on a weight percent basis, 4–5.5 Cr, 7.5–12 Co, 1.5–2.5 Mo, 1–6 W, 2–4 Re, 4.5–5.5 Al, 0.5–1.5 Ti, 8–12 Ta, 0–1 V, 0–0.5 Hf, 0.0–0.01 B, 0.0–0.2 Cb, 0.0–0.05 C, 0.0–0.01 Zr, with the balance nickel.

2. A heat treated single crystal nickel base superalloy article, consisting essentially of, by weight percent, 4–5.5 Cr, 7.5–12 Co, 1.5–2.5 Mo, 1–6 W, 2–4 Re, 4.5–5.5 Al, 0.5–1.5 Ti, 8–12 Ta, 0–1 V, 0.0–0.5 Hf, 0.0–0.01 B, 0.0–0.2 Cb, 0.0–0.05 C, 0.0–0.01 Zr, with the balance nickel.

3. The article of claim 2, having an average gamma prime particle size less than about 0.5 microns.

4. A method for producing a heat treated single crystal superalloy article, comprising the steps of:
   (a) providing a composition consisting essentially of 4–5.5 Cr, 7.5–12 Co, 1.5–2.5 Mo, 1–6 W, 2–4 Re, 4.5–5.5 Al, 0.5–1.5 Ti, 8–12 Ta, 0–1 V, 0.0–0.5 Hf, 0.0–0.01 B, 0.0–0.2 Cb, 0.0–0.05 C, 0.0–0.01 Zr, with the balance nickel;
   (b) melting and solidifying the composition to produce a single crystal article;
   (c) solutioning the article between about 2370° F. and 2410° F. for about 4 hours;
   (d) cooling the article from the solutioning temperature at a rate of at least 115° F. per minute, so as to precipitate gamma prime phase having an average size of less than 0.5 microns; and
   (e) aging the article at about 1,600° F. for 32 hours.

* * * * *